United States Patent [19]

Gaind et al.

[11] Patent Number: 4,504,330

[45] Date of Patent: Mar. 12, 1985

[54] OPTIMUM REDUCED PRESSURE EPITAXIAL GROWTH PROCESS TO PREVENT AUTODOPING

[75] Inventors: Arun K. Gaind, LaGrangeville; Subhash B. Kulkarni, Peekskill; Michael R. Poponiak, Newburgh, all of N.Y.

[73] Assignee: International Business Machines Corporation, Armonk, N.Y.

[21] Appl. No.: 543,555

[22] Filed: Oct. 19, 1983

[51] Int. Cl.³ .................. H01L 21/205; H01L 21/74; H01L 21/76

[52] U.S. Cl. ................................ 148/175; 29/576 E; 148/174; 156/606; 156/612; 156/613; 156/614

[58] Field of Search .............. 148/174, 175; 29/576 E; 156/606, 612-614

[56] References Cited

U.S. PATENT DOCUMENTS

| | | | |
|---|---|---|---|
| 3,669,769 | 6/1972 | Badami et al. | 148/175 |
| 3,765,960 | 10/1973 | Boss et al. | 148/175 |
| 4,263,336 | 4/1981 | Thompson et al. | 427/82 X |

OTHER PUBLICATIONS

IBM TDB, vol. 24, No. 3, Aug. 1981, "Eliminating Boron and Arsenic Autodoping Through Reduced Pressure", A. K. Gaind, A. A. Kozul, S. B. Kulkarni and E. Napoleon, 1731-1734.

IBM TDB, vol. 23, No. 2, Jul. 1980, "Two-Step Epitaxial Process", G. R. Srinivasan, p. 566.

IBM TDB, vol. 15, No. 11, Apr. 1973, "Minimizing Autodoping From a Substrate During the Deposition of a Silicon Epitaxial Layer", R. L. Bratter, J. L. Deines, A. K. Gaind, V. J. Lucarini, M. S. Pak and A. Spiro, p. 3385.

J. Electrochem. Soc.: Solid-State Science & Technology, Jun. 1980, "Autodoping Effects in Silicon Epitaxy", G. R. Srinivasan, pp. 1334-1342.

IEEE Transactions on Electron Devices, vol. ED-27, No. 8, Aug. 1980, "A Model for the Lateral Variation of Autodoping in Epitaxial Films", G. R. Srinivasan, pp. 1493-1496.

J. Appl. Phys. 51(9), Sep. 1980, "Flow Effects in Epitaxial Autodoping: G. R. Srinivasan, pp. 4824-4829.

J. Electrochem. Society, Oct. 1980, "A Flow Model for Autodoping in VLSI Substrates", G. R. Srinivasan, pp. 2305-2306.

Solid State Technology, Nov. 1981, "Silicon Epitaxy for High Performance Integrated Circuits", G. R. Srinivasan, pp. 101-109.

American Society for Testing & Materials, 1983, ASTM STP 804, Silicon Processing, "Modeling and Applications of Silicon Epitaxy", G. R. Srinivasan, pp. 151-173.

VLSI Science and Technology, The Electrochem. Soc., 1982, "Modeling the Autodoping Effect on Oxide-Isolated Bipolar Devices Via Efficient Variable Grid and Perturbation Method", F. Y. Chang, pp. 267-274.

J. Electrochem. Soc., vol. 125, 1978, "Kinetics of Lateral Autodoping in Silicon Epitaxy", G. R. Srinivasan, pp. 146-151.

J. Electrochem. Soc., vol. 130, No. 9, Sep. 1983, "Autodoping Phenomena in Epitaxial Silicon", G. K. Ackerman and E. Ebert, pp. 1910-1915.

Primary Examiner—William G. Saba
Attorney, Agent, or Firm—Robert J. Haase

[57] ABSTRACT

A reduced pressure epitaxial deposition method is disclosed to maximize performance and leakage limited yield of devices formed in the epitaxial layer. The method includes specified prebake and deposition conditions designed to minimize arsenic (buried subcollector) and boron (buried isolation) autodoping effects when pressures below one atmosphere are selected in accordance with the subcollector-to-isolation area ratio.

3 Claims, 4 Drawing Figures

OPTIMUM REDUCED PRESSURE EPITAXIAL GROWTH PROCESS TO PREVENT AUTODOPING

BACKGROUND OF THE INVENTION

This invention generally relates to bipolar transistor epitaxial deposition methods and, more particularly, to the selection of pressure during the epitaxial growth process to maximize bipolar device performance and leakage limited yield.

It is known that autodoping of impurity ions occurs in growing epitaxial layers as a result of the incorporation of such ions from so called "buried layer" impurity regions in the substrate upon which the epitaxial layer is grown, and in particular, the arsenic autodoping can be reduced by reduced pressure epitaxial growth as described in U.S. Pat. No. 3,765,960 entitled "Method for Minimizing Autodoping in Epitaxial Deposition" to D. W. Boss et al, Oct. 16, 1973 and assigned to the assignee of the present invention. It is also known that autodoping is a function of the autodoping source area and that boron autodoping, for example, increases with decreasing deposition pressure while arsenic autodoping increases with increasing pressure. This is discussed in the IBM ® Technical Disclosure Bulletin article "Eliminating Boron and Arsenic Autodoping Through Reduced Pressure" by A. K. Gaind et al., Vol. 24, No. 3, August 1981, page 1731, which reports the results of autodoping experiments in which various numbers of blanket boron or arsenic-diffused test wafers were placed in a reduced pressure epitaxial deposition reactor.

Although it has been surmised that an optimum epitaxial deposition pressure is required for each wafer configuration to reduce lateral autodoping, the heretofore unknown interrelationship of deposition pressure with the other parameters of device wafer processing has made autodoping minimization an elusive goal.

SUMMARY OF THE INVENTION

Epitaxial silicon is deposited upon a silicon substrate, having predetermined arsenic subcollector and boron isolation regions, under specified prebake and deposition conditions in accordance with the reduced pressure (below 760 Torr) values prescribed by the plot of FIG. 3 to maximize leakage limited yield and device performance of bipolar devices formed in the deposited epitaxial layer. The yield and performance enhancements are attributable to the minimization of arsenic and boron autodoping effects due to the presence of the arsenic and boron regions in the substrate prior to epitaxial deposition. The prescribed deposition pressure values are predicated upon the use of optimized temperature, pressure and time prebake factors and source, growth rate and temperature deposition factors.

BEST MODE FOR CARRYING OUT THE INVENTION

It has been observed that bipolar semiconductor devices experience leakage limited yield and performance degradation due to autodoping effects when epitaxial layers are deposited upon semiconductor substrates containing subcollector and isolation regions. As is well understood, subcollector and isolation regions are placed into each substrate by separate ion implementation or diffusion steps, at predetermined localized areas. The subcollector region outdiffuses into the device area of the growing epitaxial layer and serves to provide a low ohmic collector contact region for the bipolar transistor which is later formed in the overlying epitaxial layer. The isolation region customarily lies beneath a recessed oxide region which surrounds each bipolar transistor to provide electrical isolation from other transistors. The isolation region ordinarily serves as a channel stop beneath the recessed oxide as is well known.

Due to the presence of subcollectors (arsenic diffused areas) and isolation regions (boron diffused areas), autodoping occurs during the deposition of the epitaxial layer. Excessive arsenic autodoping increases subcollector-substrate capacitance ($C_{CS2}$) between neighboring transistors and reduces device switching speed and, thus, performance. Excessive boron autodoping also adversely affects device performance and, additionally, reduces leakage limited yield.

Figure 1:
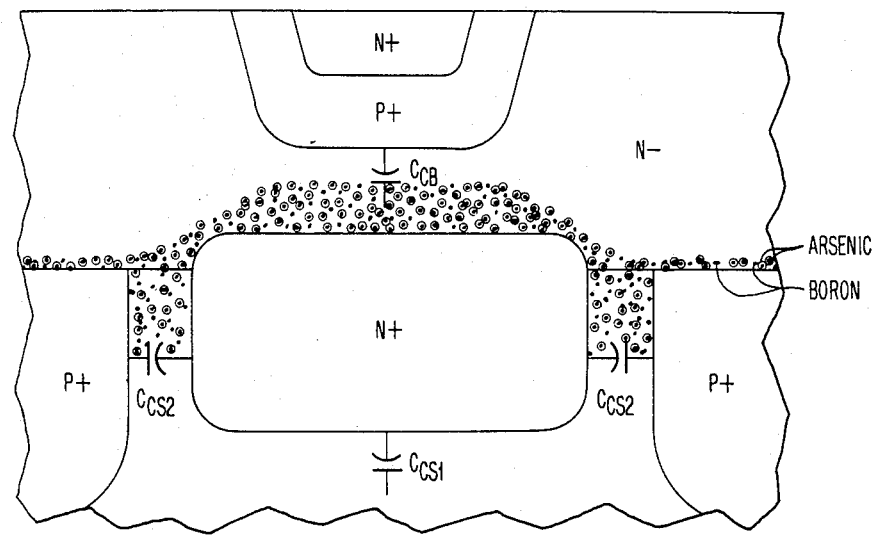
FIG. 1 is a cross sectional view of a transistor useful in explaining the performance impact of autodoping.

The cross sectional view of FIG. 1 is helpful in explaining the performance impact caused by boron and arsenic autodoping under various atmospheric-level pressure conditions for epitaxial deposition. Transistor performance is enhanced by lowering the two major capacitance components, collector-base capacitance ($C_{CB}$) and subcollector-isolation capacitance ($C_{CS2}$). Lower epitaxial deposition pressure reduces the autodoping of n type impurities and thereby lowers the capacitance. $C_{CB}$ is determined by the electrically active arsenic (vertical autodoping) present between the base and the subcollector. The $C_{CS2}$ capacitance is determined by the electrically active arsenic and boron between the p+ isolation and the subcollector (lateral autodoping). As the epitaxial deposition pressure is lowered, arsenic or n type autodoping is reduced, but the boron or p type autodoping is increased.

Figure 2:
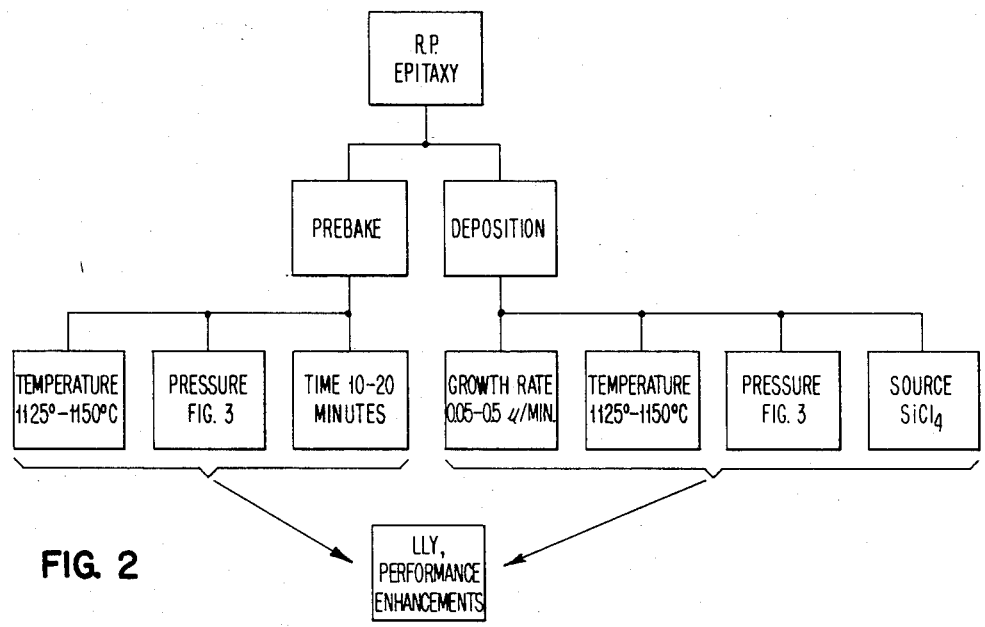
FIG. 2 is a diagram of the principal parameters relating to the use of reduced pressure epitaxial deposition, in accordance with the present invention.

In order to control the amounts of arsenic and boron autodoping during epitaxial layer deposition, attention has been directed to depositing the epitaxial layer under reduced pressure (below one atmosphere pressure) conditions. In accordance with the present invention, prebake conditions are first optimized, while deposition conditions are held fixed, to enhance leakage limited yield and device performance. The parameters of interest are outlined in FIG. 2. Prebake refers to the processing of the substrate, having arsenic subcollectors and boron isolation regions therein, prior to epi deposition in an atmosphere of hydrogen. It has been found that a prebake temperature range from about 1125° C. to about 1150° C. for about 10 to 20 minutes produces optimum results when the substrate is subjected to a reduced pressure (below 760 Torr) shown by the hatched area of FIG. 3. The specific pressure selected for a given substrate is dependent upon the subcollector-to-isolation area ratio embodied in the given substrate.

Following the completion of the prebake operation, silicon tetrachloride premixed with hydrogen is introduced into the epitaxial deposition chamber. Arsine is used to control the resistivity of the film in the range 0.1–0.3Ω cm. The growth rate is selected at a value within the range from about 0.05 to about 0.5 μm per minute while the deposition temperature is set at a value in the range from about 1125° C. to about 1150° C. as shown in FIG. 1. The epitaxial deposition pressure is determined from the hatched area of FIG. 3 below 760 Torr, in accordance with the subcollector-to-isolation ratio of the substrate.

Figure 3:
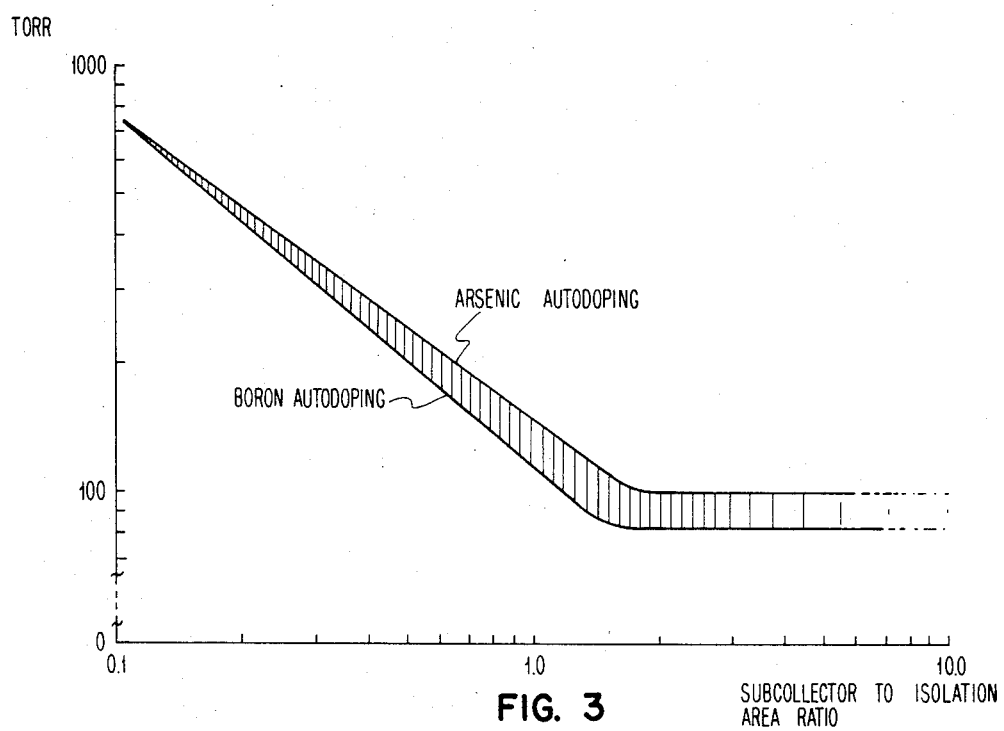
FIG. 3 is a plot of optimum reduced epitaxial deposition pressure versus the ratio of subcollector to isolation area in the substrate prior to deposition, in accordance with the present invention; and, FIG. 4 is a cross sectional view of a transistor useful in explaining the leakage limited yield impact of autodoping.

In the event that a deposition pressure higher than that indicated by the hatched area of FIG. 3 is chosen, arsenic autodoping increases and capacitance components $C_{CB}$ and $C_{CS2}$ increase by about 18% and about 30%, respectively, relative to the use of a deposition pressure of 760 Torr, lowering the transistor switching speed. A deposition pressure less than that indicated by the hatched area of FIG. 3 increases boron autodoping which also increases $C_{CS2}$, lowering the transistor switching speed. For example, for a subcollector to isolation ratio of 0.65, the use of a pressure of about 40 Torr below the optimum pressure shown in FIG. 3 increases $C_{CS2}$ by about 40%. There also is a leakage limited yield penalty from using pressures above or below the optimum pressure represented by the crosshatched area of FIG. 3. For a standard epitaxial deposition process at 760 Torr, the penalty typically is about 5 to 7%. For a pressure below the optimum pressure, the penalty is about 10%.

Figure 4:
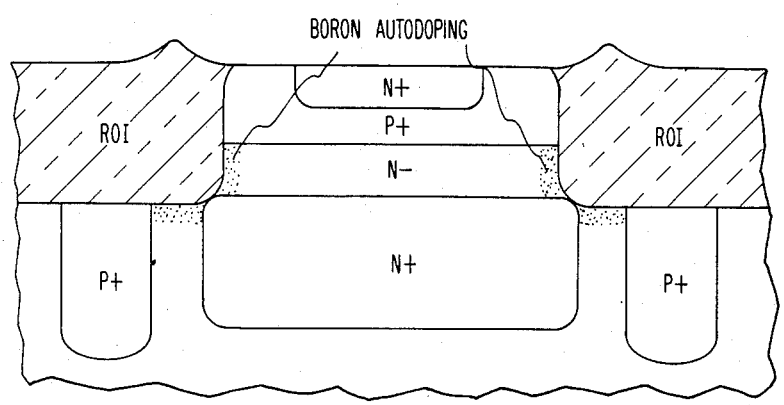

The LLY penalty by using pressures below the crosshatched pressure arise from boron autodoping causing base-to-isolation or base-to-collector leakage. This mechanism is shown in FIG. 4. The other factor limiting the value of the minimum pressure is outgassing of trace metallic impurities and adsorbed gases (such as $O_2$ and $CO_2$) from porous susceptors. This lowers leakage limited yields due to crystallographic defects appearing in the epitaxial films. This occurs typically below 80 Torr as shown in the plot in FIG. 3.

In cases where isolation is first introduced after epitaxial deposition, it should be noted that the subcollector-to-isolation ratio becomes infinite and, as shown in FIG. 3, the optimum pressure is 80 Torr.

What is claimed is:

1. A reduced pressure epitaxial deposition process comprising:
   providing a silicon substrate having an arsenic subcollector area and a boron isolation area bearing a predetermined ratio relative to each other,
   baking said substrate at a temperature in the range from about 1125° C. to about 1150° C. for a time in the range from about 10 to about 20 minutes at a pressure below one atmosphere and within the hatched area shown in the plot of FIG. 3 as a function of said ratio, and
   depositing epitaxial silicon using a silicon tetrachloride process at a temperature in said range,
   using a growth rate in the range from about 0.05 to about 0.5 micrometers per minute, and
   a pressure below one atmosphere and within the hatched area shown in said plot of FIG. 3 as a function of said ratio.

2. The method defined in claim 1 and further comprising the fabrication of bipolar transistors in said epitaxial silicon.

3. The method defined in claim 1 wherein said boron isolation area is zero and said pressure is 80 Torr.

* * * * *